US012767521B2

(12) United States Patent
Heller

(10) Patent No.: US 12,767,521 B2
(45) Date of Patent: Oct. 20, 2026

(54) MEMS DEVICE

(71) Applicant: ROHM Co., LTD., Kyoto (JP)

(72) Inventor: Martin Wilfried Heller, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 260 days.

(21) Appl. No.: 18/775,243

(22) Filed: Jul. 17, 2024

(65) Prior Publication Data

US 2025/0026632 A1 Jan. 23, 2025

(30) Foreign Application Priority Data

Jul. 18, 2023 (JP) ................................ 2023-116894

(51) Int. Cl.
*B81B 7/00* (2006.01)

(52) U.S. Cl.
CPC .... *B81B 7/0064* (2013.01); *B81B 2201/0242* (2013.01); *B81B 2203/0136* (2013.01); *B81B 2203/0163* (2013.01); *B81B 2203/0307* (2013.01); *B81B 2203/0315* (2013.01); *B81B 2203/04* (2013.01)

(58) Field of Classification Search
CPC .......... B81B 7/0064; B81B 2201/0242; B81B 2203/0136; B81B 2203/0163; B81B 2203/0307; B81B 2203/0315; B81B 2203/04; G01P 15/125; G01P 15/0888
USPC ........................................................ 73/503.3
See application file for complete search history.

(56) References Cited

U.S. PATENT DOCUMENTS

2013/0298672 A1* 11/2013 Kuhlmann ......... G01C 19/5747
73/504.12

FOREIGN PATENT DOCUMENTS

JP 2011237265 A * 11/2011
JP 2012202762 A * 10/2012
WO WO2012/002514 8/2013

OTHER PUBLICATIONS

Translation of JP-2011237265-A (Year: 2011).*
Translation of JP-2012202762-A (Year: 2012).*

* cited by examiner

*Primary Examiner* — Nathaniel T Woodward
(74) *Attorney, Agent, or Firm* — CHIP Law Group

(57) ABSTRACT

Provided is a MEMS device including a substrate, a recessed portion, and a sensor unit positioned in the recessed portion, in which the sensor unit includes a first drive frame, a second drive frame, a first detection frame, a second detection frame, a first fixation frame, a second fixation frame, a first excitation unit, a second excitation unit, a first movable electrode, a second movable electrode, a first fixation electrode, a second fixation electrode, a third fixation electrode, and a fourth fixation electrode, in which each of the first fixation electrode and the second fixation electrode is coupled to the first fixation frame through an isolation joint, the isolation joint being configured to electrically insulate and mechanically couple two members, and each of the third fixation electrode and the fourth fixation electrode is coupled to the second fixation frame through the isolation joint.

11 Claims, 9 Drawing Sheets

MEMS DEVICE

CROSS REFERENCE TO RELATED APPLICATIONS

This application claims priority benefit of Japanese Patent Application No. JP 2023-116894 filed in the Japan Patent Office on Jul. 18, 2023. Each of the above-referenced applications is hereby incorporated herein by reference in its entirety.

BACKGROUND

The present disclosure relates to a micro electro mechanical system (MEMS) device.

A MEMS device manufactured by use of a semiconductor microfabrication technique is known. An example of the MEMS device includes an electrostatic-capacitance MEMS gyro sensor (hereinafter, referred to as a gyro sensor) disclosed in PCT Patent Publication No. WO2012/002514 A1.

In the gyro sensor, when the angular acceleration in an in-plane direction parallel to a first direction acts on an element vibrating in the first direction, the Coriolis force displaces the element in a second direction orthogonal to the first direction. The displacement of the element in the second direction is detected as a change in electrostatic capacitance, and the angular acceleration acting on the element is detected according to the change.

DETAILED DESCRIPTION

A MEMS device according to embodiments of the present disclosure will be described with reference to the attached drawings. Note that the following description is essentially a mere example and is not intended to limit the present disclosure, the application of the present disclosure, or the use of the present disclosure. The drawings are schematic drawings, and the ratio of dimensions, for example, is different from those in reality.

First Embodiment

Figure 1:
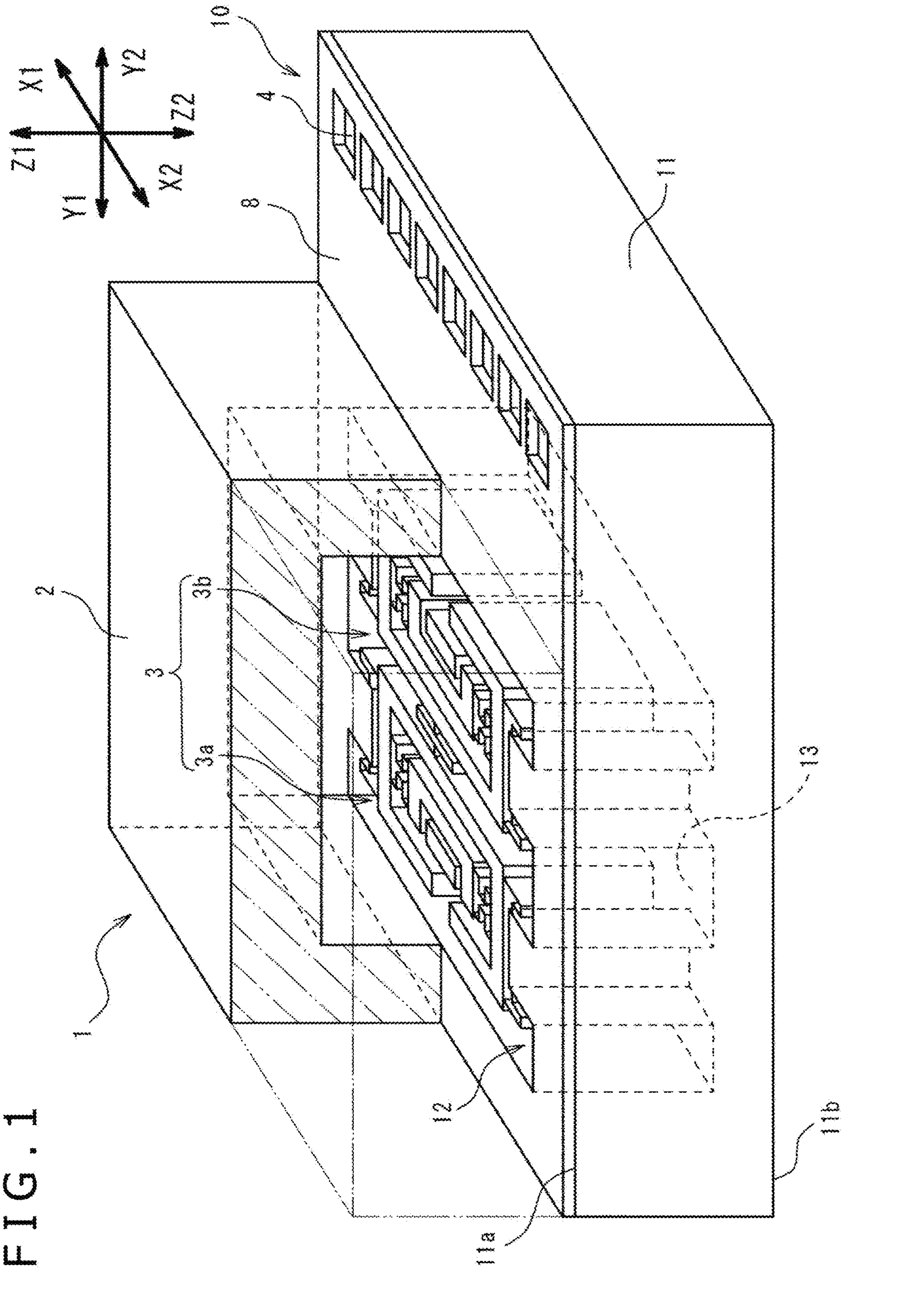
FIG. 1 is a perspective view schematically illustrating a MEMS device according to a first embodiment of the present disclosure.

A MEMS device 1 according to a first embodiment of the present disclosure will be described with reference to FIGS. 1 to 6. FIG. 1 is a perspective view illustrating the MEMS device 1. In the following description, a horizontal direction of FIG. 1 among the directions along the sides of the MEMS device 1 will be referred to as a Y direction; a vertical direction will be referred to as a Z direction; and a direction orthogonal to the Y direction and the Z direction will be referred to as an X direction. Particularly, in FIG. 1, an upper right side in FIG. 1 will be referred to as an X1 side; a lower left side will be referred to as an X2 side; a left side will be referred to as a Y1 side; a right side will be referred to as a Y2 side; and upper side will be referred to as a Z1 side; and a lower side will be referred to as a Z2 side.

As illustrated in FIG. 1, the MEMS device 1 includes a device wafer 10 that is positioned on the Z2 side and that includes a sensor unit 3 and a cap wafer 2 that is positioned on the Z1 side relative to the device wafer 10. A half of the cap wafer 2 on the X2 side is not illustrated in FIG. 1. The MEMS device 1 is a MEMS sensor manufactured by use of a semiconductor microfabrication technique, and more specifically, the MEMS device 1 is a MEMS gyro sensor.

The device wafer 10 includes a device substrate 11 and a device insulating layer 8 layered on the Z1 side of the device substrate 11. The device substrate 11 includes a first main surface 11*a* positioned on the Z1 side and extending parallel to the X direction and the Y direction, and a second main surface 11*b* positioned on the opposite side of the first main surface 11*a*, that is, the Z2 side, and extending parallel to the X direction and the Y direction. A cavity 12 recessed from the first main surface 11*a* toward the second main surface 11*b* side (that is, the Z2 side) is formed in the device substrate 11.

The device substrate 11 includes silicon doped with p-type impurities or n-type impurities in high concentration, and the device substrate 11 is conductive.

The semiconductor microfabrication technique is used to process the device substrate 11 and thereby form the cavity 12, and the sensor unit 3 is formed inside the cavity 12. Electrode pads 4 are formed on the first main surface 11*a* of the device substrate 11. The electrode pads 4 are electrically connected to the sensor unit 3 through unillustrated device wiring, and electrical signals are input and output between the electrode pads 4 and the sensor unit 3.

The electrode pads 4 are positioned outside the cap wafer 2 in plan view. Part of the device insulating layer 8 corresponding to the electrode pads 4 is so removed that the electrode pads 4 are exposed on the Z1 side after the sensor unit 3 is sealed by the cap wafer 2.

Figure 2:
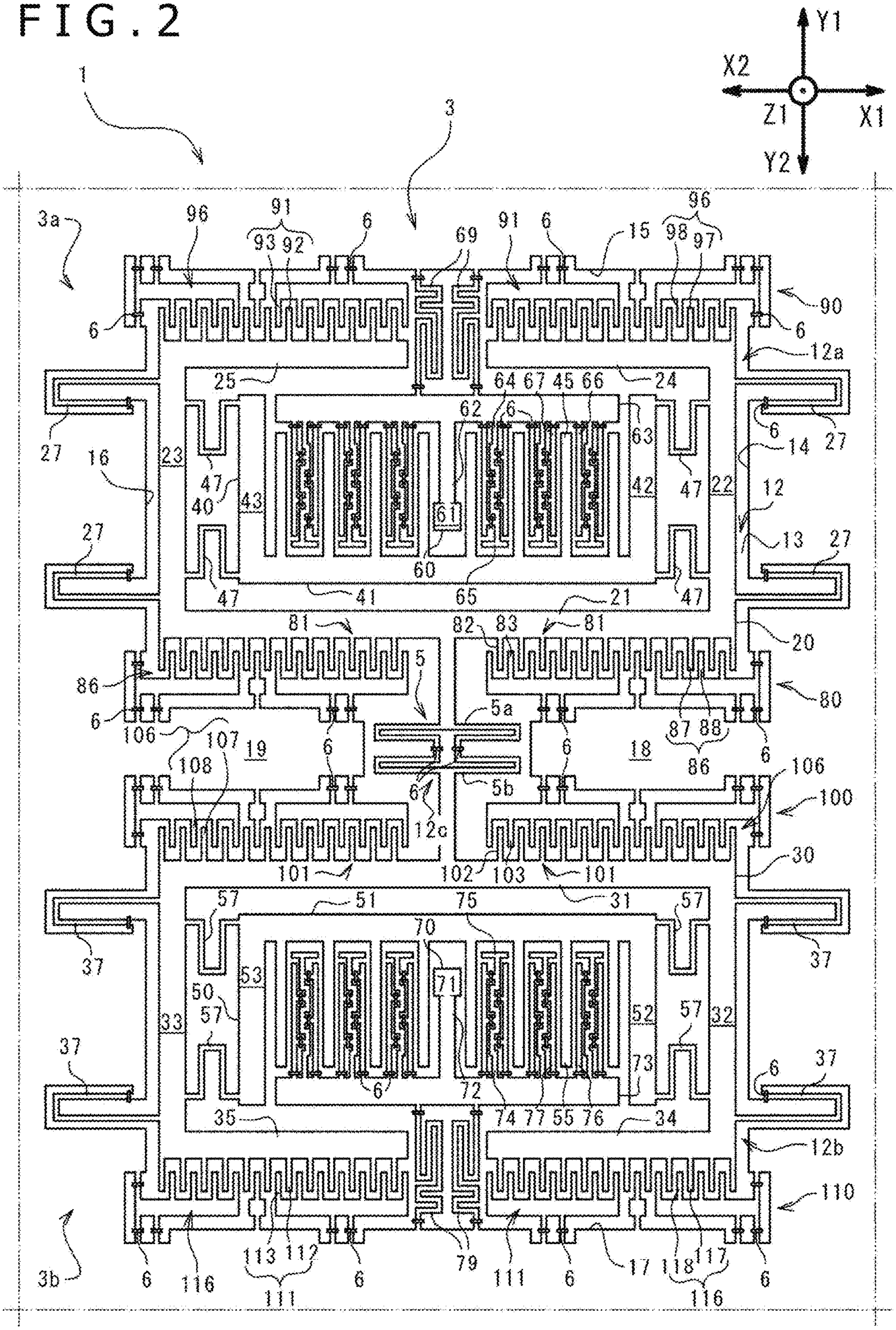
FIG. 2 is a plan view schematically illustrating a sensor unit.

FIG. 2 is a plan view of the surroundings of the sensor unit 3 in the device wafer 10 as viewed from the Z1 side. The device insulating layer 8 and the device wiring are not illustrated in FIG. 2. As illustrated in FIG. 2, the cavity 12 is defined by a rectangular bottom wall 13 with sides parallel to the X direction and the Y direction, a first vertical wall 14 rising from an edge of the bottom wall 13 on the X1 side toward the Z1 side, a second vertical wall 15 rising from an edge of the bottom wall 13 on the Y1 side toward the X1 side, a third vertical wall 16 rising from an edge of the bottom wall 13 on the X2 side toward the X1 side, and a fourth vertical wall 17 rising from an edge of the bottom wall 13 on the Y2 side toward the X1 side.

The cavity 12 includes a pair of fifth vertical wall 18 and sixth vertical wall 19 in the X direction rising from the bottom wall 13 toward the Z1 side at the Y direction center part. The fifth vertical wall 18 extends from the Y direction center part of the first vertical wall 14 and terminates before the X direction center part of the cavity 12. The sixth vertical wall 19 extends from the Y direction center part of the third vertical wall 16 and terminates before the X direction center part of the cavity 12. The fifth vertical wall 18 and the sixth vertical wall 19 are separated in the X direction.

That is, the cavity 12 is partitioned in the Y direction by the pair of fifth vertical wall 18 and sixth vertical wall 19. Specifically, the cavity 12 includes a first cavity 12*a* in a section on the Y1 side of the pair of fifth vertical wall 18 and sixth vertical wall 19; a second cavity 12*b* in a section on the Y2 side of the pair of fifth vertical wall 18 and sixth vertical wall 19; and a third cavity 12*c* in a section between the pair of fifth vertical wall 18 and sixth vertical wall 19 in the X direction. The third cavity 12*c* connects the first cavity 12*a* and the second cavity 12*b* in the Y direction.

The sensor unit 3 includes a first sensor 3*a* positioned on the first cavity 12*a*; a second sensor 3*b* positioned on the second cavity 12*b*; and a coupling spring 5 positioned on the third cavity 12*c* and configured to couple the first sensor 3*a* and the second sensor 3*b* in the Y direction.

The first sensor 3*a* includes a first drive frame 20 displaceable in the Y direction relative to the device substrate 11; a first detection frame 40 displaced in the Y direction along with the first drive frame 20 and displaceable in the X direction relative to the first drive frame 20; and a first fixation frame 60 supported by the bottom wall 13 of the cavity 12 and not displaceable relative to the device substrate 11.

The first drive frame 20 includes a first drive first frame 21 extending in the X direction on the Y2 side of the first cavity 12*a*; a first drive second frame 22 extending from the X1 side end of the first drive first frame 21 toward the Y1 side; a first drive third frame 23 extending from the X2 side end of the first drive first frame 21 toward the Y1 side; a first drive fourth frame 24 extending from the Y1 side end of the first drive second frame 22 toward the X2 side and terminating before the X direction center part of the first cavity 12*a*; and a first drive fifth frame 25 extending from the Y1 side end of the first drive third frame 23 toward the X1 side and terminating before the X direction center part of the first cavity 12*a*.

The sensor unit 3 further includes a pair of first drive springs 27 in the Y direction that support the first drive second frame 22 in a manner that the first drive second frame 22 is displaceable in the Y direction relative to the first vertical wall 14. The pair of first drive springs 27 are also provided between the first drive third frame 23 and the third vertical wall 16 in the Y direction. Thus, the pairs of first drive springs 27 provided in the Y direction on both sides in the X direction elastically support the first drive frame 20 in a manner that the first drive frame 20 is displaceable in the Y direction relative to the first vertical wall 14 and the third vertical wall 16. The first drive frame 20 is separated to the Z1 side from the bottom wall 13 of the cavity 12.

The first drive springs 27 are electrically insulated and mechanically coupled to the first vertical wall 14 and the third vertical wall 16 through an isolation joint (hereinafter, referred to as IJ) 6. The IJ 6 is a silicon oxide member provided by, for example, etching the device substrate 11 made of conductive silicon to form a trench recessed from the first main surface 11*a* toward the Z2 side. The inner wall surface of the trench is then thermally oxidized to form the IJ 6 including the inner wall surface grown by the thermal oxidization. The IJ 6 mechanically couples and electrically insulates the parts positioned on both sides across the IJ 6.

The first detection frame 40 includes a first detection first frame 41 extending in the X direction at the position adjacent to the Y1 side of the first drive first frame 21; a first detection second frame 42 adjacent to the X2 side of the first drive second frame 22 and extending from the X1 side end of the first detection first frame 41 toward the Y1 side; and a first detection third frame 43 adjacent to the X1 side of the first drive third frame 23 and extending from the X2 side end of the first detection first frame 41 toward the Y1 side.

The sensor unit 3 further includes a pair of first detection springs 47 in the Y direction supporting the first detection second frame 42 in a manner that the first detection second frame 42 is not displaceable in the Y direction but displaceable in the X direction relative to the first drive second frame 22. The pair of first detection springs 47 are also provided between the first detection third frame 43 and the first drive third frame 23 in the Y direction. Thus, the pairs of first detection springs 47 provided in the Y direction on both sides in the X direction elastically support the first detection frame 40 in a manner that the first detection frame 40 is not displaceable in the Y direction but displaceable in the X direction relative to the first drive frame 20. The first detection frame 40 is separated to the Z1 side from the bottom wall 13 of the cavity 12.

A first movable electrode 45 extending toward the Y1 side is formed on the first detection first frame 41. A plurality of first movable electrodes 45 are provided at intervals in the X direction.

The first fixation frame 60 includes a first anchor 61 rising from the bottom wall 13 of the cavity 12 toward the Z1 side at the position of the X direction center part of the first cavity 12*a* adjacent to the Y1 side of the first detection first frame 41; a first fixation first frame 62 extending from the first anchor 61 toward the Y1 side; and a first fixation second frame 63 extending from the Y1 side end of the first fixation first frame 62 toward both sides in the X direction. The first fixation first frame 62 and the first fixation second frame 63 are separated to the Z1 side from the bottom wall 13 of the cavity 12.

A first fixation electrode 66 and a second fixation electrode 67 extending parallel to each other from the first fixation second frame 63 toward the Y2 side are formed on the first fixation frame 60. The first fixation electrode 66 faces the first movable electrode 45 from the X1 side. The second fixation electrode 67 faces the first movable electrode 45 from the X2 side. That is, the first movable electrode 45 may be positioned between the pair of first fixation electrode 66 and second fixation electrode 67 in the X direction.

The first fixation frame 60 further includes a first fixation third frame 64 extending from the first fixation second frame 63 toward the Y2 side and positioned between the first fixation electrode 66 and the second fixation electrode 67 positioned between the pair of first movable electrodes 45 adjacent to each other in the X direction; and a first fixation fourth frame 65 extending in the X direction at the Y2 side end of the first fixation third frame 64. The potential of the first fixation third frame 64 and the first fixation fourth frame 65 is the same as the potential of the first fixation second frame 63.

The first fixation electrode 66 and the second fixation electrode 67 are electrically insulated and mechanically coupled to the first fixation second frame 63 through the IJ 6. The first fixation electrode 66 and the second fixation electrode 67 are coupled to the first fixation third frame 64 through the IJ 6. The first fixation fourth frame 65 is positioned between the first detection first frame 41 in the Y direction and the first fixation electrode 66 and the second fixation electrode 67.

The first sensor 3*a* further includes a first excitation unit 80 positioned on the Y2 side of the first sensor 3*a* and configured to displace the first sensor 3*a* toward the Y2 side; and a second excitation unit 90 positioned on the Y1 side of the first sensor 3*a* and configured to displace the first sensor 3*a* toward the Y1 side.

The first excitation unit 80 includes a first drive unit 81 electrically driven and configured to use the electrostatic attraction to displace the first sensor 3*a* toward the Y2 side; and a first displacement detection unit 86 that detects the displacement of the first sensor 3*a* in the Y direction.

The first drive unit 81 includes a comb-like first drive movable electrode 82 extending toward the Y2 side from the part positioned on the X direction center side of the first cavity 12*a* in the Y2 side end of the first drive first frame 21; and a comb-like first drive fixation electrode 83 with one end connected to the fifth vertical wall 18 and the sixth vertical wall 19 through the IJ 6 and another end engaged with the first drive movable electrode 82.

The first displacement detection unit 86 includes a comb-like first displacement detection movable electrode 87 extending toward the Y2 side from the parts positioned on both sides of the first drive movable electrode 82 in the X direction in the Y2 side end of the first drive first frame 21; and a comb-like first displacement detection fixation electrode 88 with one end connected to the fifth vertical wall 18 and the sixth vertical wall 19 through the IJ 6 and another end engaged with the first displacement detection movable electrode 87.

The second excitation unit 90 includes a second drive unit 91 electrically driven and configured to use the electrostatic attraction to displace the first sensor 3*a* toward the Y1 side; and a second displacement detection unit 96 that detects the displacement of the first sensor 3*a* in the Y direction.

The second drive unit 91 includes a comb-like second drive movable electrode 92 extending toward the Y1 side from the part positioned on the X direction center side of the first cavity 12*a* in the Y2 side ends of the first drive fourth frame 24 and the first drive fifth frame 25; and a comb-like second drive fixation electrode 93 with one end connected to the second vertical wall 15 through the IJ 6 and another end engaged with the second drive movable electrode 92.

The second displacement detection unit 96 includes a comb-like second displacement detection movable electrode 97 extending toward the Y1 side from the parts positioned on both sides of the second drive movable electrode 92 in the X direction in the Y1 side ends of the first drive fourth frame 24 and the first drive fifth frame 25; and a comb-like second displacement detection fixation electrode 98 with one end connected to the second vertical wall 15 through the IJ 6 and another end engaged with the second displacement detection movable electrode 97.

As illustrated in FIG. 2, the second sensor 3*b* is symmetrical to the first sensor 3*a* in the Y direction, and the second sensor 3*b* includes a second drive frame 30, a second detection frame 50, and a second fixation frame 70. The second drive frame 30, the second detection frame 50, and the second fixation frame 70 are symmetrical to the first drive frame 20, the first detection frame 40, and the first fixation frame 60 in the Y direction. The reference signs of the components corresponding to the first drive frame 20, the first detection frame 40, and the first fixation frame 60 are replaced with reference signs 30*s*, 50*s*, and 70*s*, respectively, in the illustrated drawings.

The second detection frame 50 includes a second movable electrode 55 in place of the first movable electrode 45, and the second fixation frame 70 includes a third fixation electrode 76 and a fourth fixation electrode 77 in place of the first fixation electrode 66 and the second fixation electrode 67. The third fixation electrode 76 faces the second movable electrode 55 from the X1 side. The fourth fixation electrode 77 faces the second movable electrode 55 from the X2 side. That is, the second movable electrode 55 may be positioned between the pair of third fixation electrode 76 and fourth fixation electrode 77 in the X direction.

The second sensor 3*b* is symmetrical to the first sensor 3*a* in the Y direction. Thus, a third excitation unit 100 that corresponds to the first excitation unit 80 and that is configured to displace the second sensor 3*b* toward the Y1 side is positioned on the Y1 side of the second sensor 3*b*, and a fourth excitation unit 110 that corresponds to the second excitation unit 90 and that is configured to displace the second sensor 3*b* toward the Y2 side is positioned on the Y2 side of the second sensor 3*b*.

The third excitation unit 100 includes a third drive unit 101 electrically driven and configured to use the electrostatic attraction to displace the second sensor 3*b* toward the Y1 side; and a third displacement detection unit 106 that detects the displacement of the second sensor 3*b* in the Y direction.

The third drive unit 101 includes a comb-like third drive movable electrode 102 extending toward the Y1 side from the part positioned on the X direction center side of the second cavity 12*b* in the Y1 side end of the second drive first frame 31; and a comb-like third drive fixation electrode 103 with one end connected to the fifth vertical wall 18 and the sixth vertical wall 19 through the IJ 6 and another end engaged with the third drive movable electrode 102.

The third displacement detection unit 106 includes a comb-like third displacement detection movable electrode 107 extending toward the Y1 side from the parts positioned on both sides of the third drive movable electrode 102 in the X direction in the Y1 side end of the second drive first frame 31; and a comb-like third displacement detection fixation electrode 108 with one end connected to the fifth vertical wall 18 and the sixth vertical wall 19 through the IJ 6 and another end engaged with the third displacement detection movable electrode 107.

The fourth excitation unit 110 includes a fourth drive unit 111 electrically driven and configured to use the electrostatic attraction to displace the second sensor 3*b* toward the Y2 side; and a fourth displacement detection unit 116 that detects the displacement of the second sensor 3*b* in the Y direction.

The fourth drive unit 111 includes a comb-like fourth drive movable electrode 112 extending toward the Y2 side from the part positioned on the X direction center side of the second cavity 12*b* in the Y2 side ends of the second drive fourth frame 34 and the second drive fifth frame 35; and a comb-like fourth drive fixation electrode 113 with one end connected to the fourth vertical wall 17 through the IJ 6 and another end engaged with the fourth drive movable electrode 112.

The fourth displacement detection unit 116 includes a comb-like fourth displacement detection movable electrode 117 extending toward the Y2 side from the parts positioned on both sides of the fourth drive movable electrode 112 in the X direction in the Y2 side ends of the second drive fourth frame 34 and the second drive fifth frame 35; and a comb-like fourth displacement detection fixation electrode 118 with one end connected to the fourth vertical wall 17 through the IJ 6 and another end engaged with the fourth displacement detection movable electrode 117.

The coupling spring 5 elastically couples the first sensor 3*a* and the second sensor 3*b* in the Y direction. The coupling spring 5 is configured to vibrate the first sensor 3*a* (that is, the first drive frame 20 and the first detection frame 40) and the second sensor 3*b* (that is, the second drive frame 30 and the second detection frame 50) in the Y direction in opposite phases.

In the present embodiment, the coupling spring 5 includes a first coupling spring 5*a* connected to the first sensor 3*a* (first drive frame 20); a second coupling spring 5*b* connected to the second sensor 3*b* (second drive frame 30); and the IJ 6 that couples the first coupling spring 5*a* and the second coupling spring 5*b*. Thus, the first sensor 3*a* and the second sensor 3*b* are electrically insulated by the IJ 6. In other words, the first movable electrode 45 of the first sensor 3*a* and the second movable electrode 55 of the second sensor 3*b* are electrically insulated from each other.

Next, an electrical connection relation of the sensor unit 3 will be described.

The first drive frame 20 is electrically connected to the unillustrated device wiring connected to the electrode pads 4 (see FIG. 1) through at least one of the plurality of first drive springs 27. The first drive frame 20 is connected to the first detection frame 40 through the first detection spring 47, and hence, the potential of the first detection frame 40 and the first movable electrode 45 is the same as the potential of the first drive frame 20.

The first fixation electrode 66 and the second fixation electrode 67 are connected to the first fixation frame 60 through the IJ 6. The first fixation electrode 66 and the second fixation electrode 67 are electrically insulated from each other and electrically insulated from the first fixation frame 60. The first fixation frame 60 is connected to the second vertical wall 15 through a pair of flex leads 69. The pair of flex leads 69 are connected to the first fixation frame 60 and the second vertical wall 15 through the IJ 6, at each of the two ends in the Y direction.

The first fixation electrode 66 and the second fixation electrode 67 are electrically connected to the pair of flex leads 69, respectively, through the unillustrated device wiring layered on the first fixation frame 60 through the device insulating layer 8. The pair of flex leads 69 are electrically connected to the electrode pads 4 (see FIG. 1), respectively, through the unillustrated device wiring. The rigidity of the flex leads 69 is lower than the rest of the part. The flex leads 69 can easily be deformed in the X direction and the Y direction, and the stress is less likely to be transmitted between the first fixation frame 60 and the second vertical wall 15.

The second drive frame 30 is electrically connected to the unillustrated device wiring connected to the electrode pads 4 (see FIG. 1) through at least one of a plurality of second drive springs 37. The second drive frame 30 is connected to the second detection frame 50 through second detection springs 57, and hence, the potential of the second detection frame 50 and the second movable electrode 55 is the same as the potential of the second drive frame 30.

The second drive frame 30 is electrically insulated from the first drive frame 20 at the IJ 6 of the coupling spring 5. Hence, the first movable electrode 45 and the second movable electrode 55 are electrically insulated from each other.

The third fixation electrode 76 and the fourth fixation electrode 77 are connected to the second fixation frame 70 through the IJ 6. The third fixation electrode 76 and the fourth fixation electrode 77 are electrically insulated from each other and electrically insulated from the second fixation frame 70. The second fixation frame 70 is connected to the fourth vertical wall 17 through a pair of flex leads 79. The pair of flex leads 79 are connected to the second fixation frame 70 and the fourth vertical wall 17 through the IJ 6, at each of the two ends in the Y direction.

The third fixation electrode 76 and the fourth fixation electrode 77 are each electrically connected to the pair of flex leads 79 through the unillustrated device wiring layered on the second fixation frame 70 through the device insulating layer 8. The pair of flex leads 79 are each electrically connected to the electrode pads 4 (see FIG. 1) through the unillustrated device wiring.

The third fixation electrode 76 is electrically connected to the first fixation electrode 66 through the unillustrated device wiring, and the potential of the third fixation electrode 76 is the same as the potential of the first fixation electrode 66. The fourth fixation electrode 77 is electrically connected to the second fixation electrode 67 through the unillustrated device wiring, and the potential of the fourth fixation electrode 77 is the same as the potential of the second fixation electrode 67.

The first drive fixation electrode 83 is electrically connected to the electrode pads 4 through the unillustrated device wiring. The first drive unit 81 provides a capacitor that generates electrostatic attraction for the comb-like first drive movable electrode 82 and the comb-like first drive fixation electrode 83 engaged with the first drive movable electrode 82 to displace the first sensor 3*a* toward the Y2 side.

The second drive fixation electrode 93 is electrically connected to the electrode pads 4 through the unillustrated device wiring. The second drive unit 91 provides a capacitor that generates electrostatic attraction for the comb-like second drive movable electrode 92 and the comb-like second drive fixation electrode 93 engaged with the second drive movable electrode 92 to displace the first sensor 3*a* toward the Y1 side.

The third drive fixation electrode 103 is electrically connected to the first drive fixation electrode 83 through the unillustrated device wiring. The third drive unit 101 provides a capacitor that generates electrostatic attraction for the comb-like third drive movable electrode 102 and the comb-like third drive fixation electrode 103 engaged with the third drive movable electrode 102 to displace the second sensor 3*b* toward the Y2 side.

The fourth drive fixation electrode 113 is electrically connected to the second drive fixation electrode 93 through the unillustrated device wiring. The fourth drive unit 111 provides a capacitor that generates electrostatic attraction for the comb-like fourth drive movable electrode 112 and the comb-like fourth drive fixation electrode 113 engaged with the fourth drive movable electrode 112 to displace the second sensor 3*b* toward the Y1 side.

The first displacement detection fixation electrode 88 is electrically connected to the electrode pads 4 through the unillustrated device wiring. The second displacement detection fixation electrode 98 is electrically connected to the electrode pads 4 through the unillustrated device wiring. The third displacement detection fixation electrode 108 is electrically connected to the electrode pads 4 through the unillustrated device wiring. The fourth displacement detection fixation electrode 118 is electrically connected to the electrode pads 4 through the unillustrated device wiring.

Next, circuit configurations of the MEMS device 1 will be described.

Figure 3:
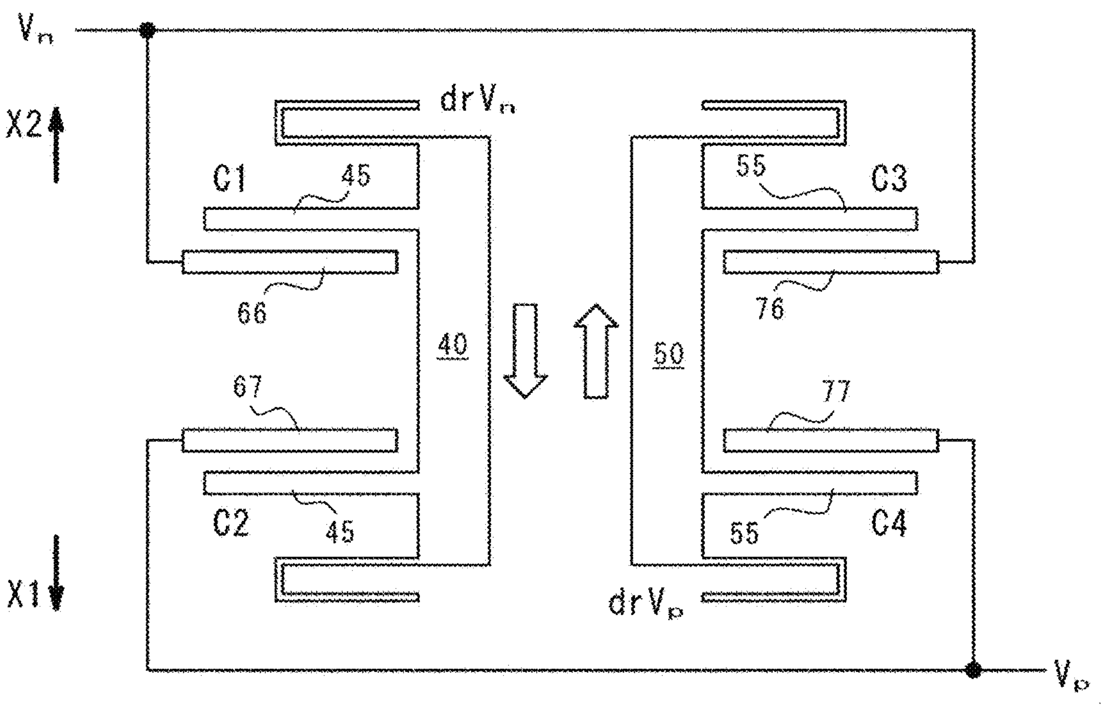
FIG. 3 is a simplified configuration diagram of the sensor unit.

A circuit configuration for detecting the displacement of the first detection frame 40 and the second detection frame 50 in the X direction will be described first. FIG. 3 is a schematic configuration diagram regarding the detection of displacement of the first detection frame 40 and the second detection frame 50 of the sensor unit 3 in the X direction.

As illustrated in FIG. 3, the first movable electrode 45 and the first fixation electrode 66 facing the first movable electrode 45 form a first capacitor C1; the first movable electrode 45 and the second fixation electrode 67 facing the first movable electrode 45 form a second capacitor C2; the second movable electrode 55 and the third fixation electrode 76 facing the second movable electrode 55 form a third capacitor C3; and the second movable electrode 55 and the fourth fixation electrode 77 facing the second movable electrode 55 form a fourth capacitor C4.

Figure 4:
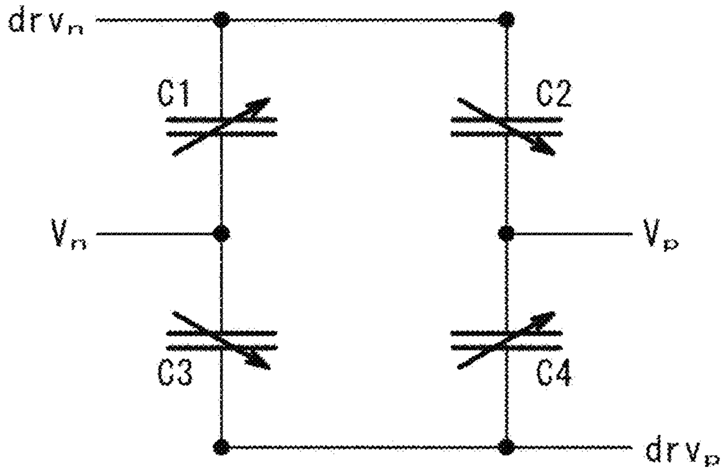
FIG. 4 is an equivalent circuit diagram of FIG. 3.

FIG. 4 is an equivalent circuit diagram of the first to fourth capacitors C1 to C4. As illustrated in FIG. 4, the first capacitor C1 and the third capacitor C3 are connected in series, and the second capacitor C2 and the fourth capacitor C4 are connected in series. A first input voltage drVn that is an alternating current (AC) voltage is applied to the first movable electrode 45 through the first drive frame 20, and a second input voltage drVp that is an AC voltage in the phase opposite the phase of the first input voltage drVn is applied to the second movable electrode 55 through the second drive frame 30. A first output voltage Vn of the first fixation electrode 66 and the third fixation electrode 76 and a second output voltage Vp of the second fixation electrode 67 and the fourth fixation electrode 77 at this point are detected.

It is assumed, for example, that an angular acceleration around the Z direction acts on the MEMS device 1 while the first to fourth excitation units 80, 90, 100, and 110 repetitively displace the first sensor 3*a* and the second sensor 3*b* toward the Y1 side and toward the Y2 side in opposite phases at a predetermined frequency. In this case, the Coriolis force generated in the sensor unit 3 displaces the first detection frame 40 toward the X2 side or the X1 side and displaces the second detection frame 50 toward the X1 side or the X2 side in the phase opposite the phase in the displacement of the first detection frame 40.

When, for example, the first detection frame 40 is displaced toward the X1 side and the second detection frame 50 is displaced toward the X2 side, the electrostatic capacitance of the first capacitor C1 and the fourth capacitor C4 increases with a decrease in the gaps between the fixation electrodes and the movable electrodes of the first capacitor C1 and the fourth capacitor C4, and the electrostatic capacitance of the second capacitor C2 and the third capacitor C3 decreases with an increase in the gaps between the fixation electrodes and the movable electrodes of the second capacitor C2 and the third capacitor C3.

As a result, when the first input voltage drVn is applied to the first movable electrode 45 and the second input voltage drVp in the opposite phase is applied to the second movable electrode 55, the first output voltage Vn and the second output voltage Vp symmetrical to each other across intermediate potential are detected. The first output voltage Vn and the second output voltage Vp may similarly include common mode noise.

A difference between the first output voltage Vn and the second output voltage Vp can be calculated to obtain an output in which the common mode noise, for example, is cancelled. The first sensor 3*a* and the second sensor 3*b* are mechanically coupled through the coupling spring 5, and the first drive frame 20 and the second drive frame 30 can be accurately synchronized with each other and easily displaced in the Y direction in opposite phases. Hence, the first output voltage Vn and the second output voltage Vp in opposite phases can be accurately detected, and the difference between the voltages can be calculated to obtain the output in which the common mode noise is removed. The angular acceleration acting on the MEMS device 1 can be accurately calculated based on the output. That is, the first to fourth capacitors C1 to C4 can provide a fully differential circuit.

Figure 5:
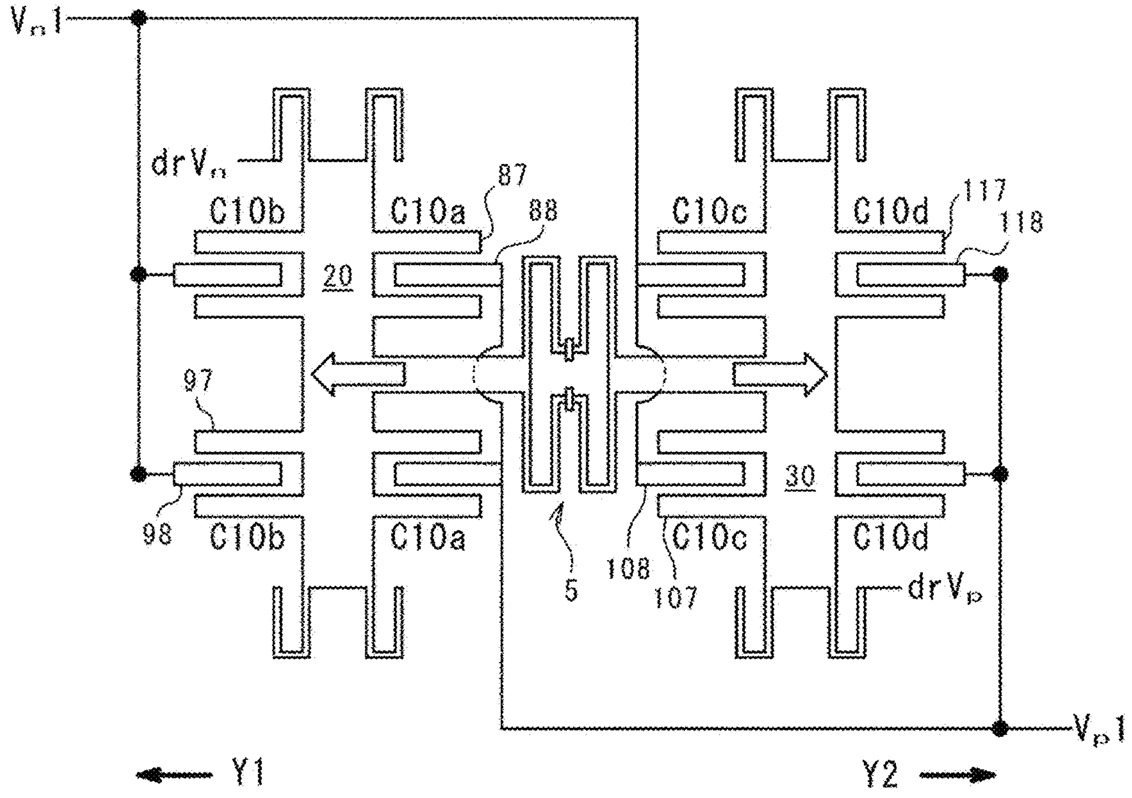
FIG. 5 is a simplified configuration diagram of a displacement detection unit.

Next, a circuit configuration for exciting the first drive frame 20 and the second drive frame 30 in the Y direction will be described. FIG. 5 illustrates a schematic configuration diagram regarding the detection of displacement of the first drive frame 20 and the second drive frame 30 of the sensor unit 3 in the Y direction.

As illustrated in FIG. 5, the comb-like first displacement detection movable electrode 87 and the comb-like first displacement detection fixation electrode 88 engaged with the first displacement detection movable electrode 87 form a first displacement detection capacitor C10*a*; the comb-like second displacement detection movable electrode 97 and the comb-like second displacement detection fixation electrode 98 engaged with the second displacement detection movable electrode 97 form a second displacement detection capacitor C10*b*; the comb-like third displacement detection movable electrode 107 and the comb-like third displacement detection fixation electrode 108 engaged with the third displacement detection movable electrode 107 form a third displacement detection capacitor C10*c*; and the comb-like fourth displacement detection movable electrode 117 and the comb-like fourth displacement detection fixation electrode 118 engaged with the fourth displacement detection movable electrode 117 form a fourth displacement detection capacitor C10*d*.

Figure 6:
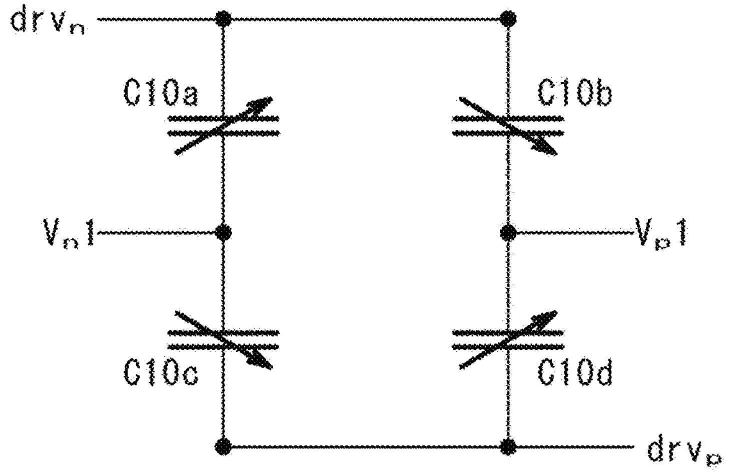
FIG. 6 is an equivalent circuit diagram of FIG. 5.

FIG. 6 is an equivalent circuit diagram of the first to fourth displacement detection capacitors C10*a* to C10*d*. As illustrated in FIG. 6, the first displacement detection capacitor C10*a* and the third displacement detection capacitor C10*c* are connected in series, and the second displacement detection capacitor C10*b* and the fourth displacement detection capacitor C10*d* are connected in series. The first input voltage drVn that is an AC voltage is applied to the first displacement detection movable electrode 87 and the second displacement detection movable electrode 97 through the first drive frame 20, and the second input voltage drVp that is an AC voltage in the phase opposite the phase of the first input voltage drVn is applied to the third displacement detection movable electrode 107 and the fourth displacement detection movable electrode 117 through the second drive frame 30.

A first output voltage Vn1 of the second displacement detection fixation electrode 98 and the third displacement detection fixation electrode 108 and a second output voltage Vp1 of the first displacement detection fixation electrode 88 and the fourth displacement detection fixation electrode 118 at this point are detected.

It is assumed, for example, that the first to fourth excitation units 80, 90, 100, and 110 displace the first sensor 3*a* toward the Y1 side and displace the second sensor 3*b* toward the Y2 side. In this case, the electrostatic capacitance of the second displacement detection capacitor C10*b* and the fourth displacement detection capacitor C10*d* increases with an increase in the facing area of the electrodes of the second displacement detection capacitor C10*b* and the fourth displacement detection capacitor C10*d*, and the electrostatic capacitance of the first displacement detection capacitor C10*a* and the third displacement detection capacitor C10*c* decreases with a decrease in the facing area between the electrodes of the first displacement detection capacitor C10*a* and the third displacement detection capacitor C10*c*.

As a result, when the first input voltage drVn is applied to the first displacement detection movable electrode 87 and the second displacement detection movable electrode 97 through the first drive frame 20 and the second input voltage drVp in the opposite phase is applied to the third displacement detection movable electrode 107 and the fourth displacement detection movable electrode 117 through the second drive frame 30, the first output voltage Vn1 and the second output voltage Vp1 symmetrical to each other across intermediate potential are detected. The first output voltage Vn1 and the second output voltage Vp1 may similarly include common mode noise.

A difference between the first output voltage Vn1 and the second output voltage Vp1 can be calculated to obtain an output in which the common mode noise, for example, is cancelled. Hence, the difference can be calculated to obtain the output in which the common mode noise is removed. The displacement of the first sensor 3*a* and the second sensor 3*b* in the Y direction can be accurately calculated based on the output. The calculated displacement of the first sensor 3*a* and the second sensor 3*b* in the Y direction can be fed back to allow the first to fourth drive units 81, 91, 101, and 111 to accurately excite the first sensor 3*a* and the second sensor 3*b* in the Y direction in opposite phases. That is, the first to fourth displacement detection capacitors C10*a* to C10*d* can provide a fully differential circuit.

The MEMS device 1 according to the embodiment can obtain the following effects.

(1)

The MEMS device 1 includes
- the device substrate 11 including the first main surface 11*a* and the second main surface 11*b* facing the first main surface 11*a*,
- the cavity 12 recessed from the first main surface 11*a* toward the second main surface 11*b* relative to the device substrate 11, and
- the sensor unit 3 positioned in the cavity 12, in which the sensor unit 3 includes
  - the first drive frame 20 excited in the Y direction,
  - the second drive frame 30 mechanically connected to the first drive frame 20 through the coupling spring 5 and excited in the Y direction in the phase opposite the phase of the first drive frame 20,
  - the first detection frame 40 mechanically connected to the first drive frame 20 through the first detection spring 47, displaceable in the Y direction along with the first drive frame 20, and displaceable in the X direction orthogonal to the Y direction relative to the first drive frame 20,
  - the second detection frame 50 mechanically connected to the second drive frame 30 through the second detection spring 57, displaceable in the Y direction along with the second drive frame 30, and displaceable in the X direction relative to the second drive frame 30,
  - the first fixation frame 60 supported in such a manner that the first fixation frame 60 is not movable relative to the bottom wall 13 defining the cavity 12,
  - the second fixation frame 70 supported in such a manner that the second fixation frame 70 is not movable relative to the bottom wall 13 defining the cavity 12,
  - the first excitation unit 80 and the second excitation unit 90 that use the electrostatic attraction to excite the first drive frame 20 in the Y direction,
  - the third excitation unit 100 and the fourth excitation unit 110 that use the electrostatic attraction to excite the second drive frame 30 in the Y direction in the phase opposite the phase in the excitation by the first excitation unit 80 and the second excitation unit 90,
  - the first movable electrode 45 extending in the Y direction from the first detection frame 40,
  - the second movable electrode 55 extending in the Y direction from the second detection frame 50 and electrically insulated from the first movable electrode 45,
  - the first fixation electrode 66 extending in the Y direction from the first fixation frame 60 and facing the first movable electrode 45 from the X1 side,
  - the second fixation electrode 67 extending in the Y direction from the first fixation frame 60, facing the first movable electrode 45 from the X2 side, and electrically insulated from the first fixation electrode 66,
  - the third fixation electrode 76 extending in the Y direction from the second fixation frame 70 and facing the second movable electrode 55 from the X1 side, the potential of the third fixation electrode 76 being the same as the potential of the first fixation electrode 66, and
  - the fourth fixation electrode 77 extending in the Y direction from the second fixation frame 70 and facing the second movable electrode 55 from the X2 side, the potential of the fourth fixation electrode 77 being the same as the potential of the second fixation electrode 67,
- each of the first fixation electrode 66 and the second fixation electrode 67 is coupled to the first fixation frame 60 through the IJ 6, the IJ 6 being configured to electrically insulate and mechanically couple two members, and
- each of the third fixation electrode 76 and the fourth fixation electrode 77 is coupled to the second fixation frame 70 through the IJ 6.

As a result, when the angular acceleration acts on the MEMS device 1 around the axis parallel to the Z direction while the first to fourth excitation units 80, 90, 100, and 110 vibrate the first and second drive frames 20 and 30 in the Y direction in opposite phases, the Coriolis force displaces the first and second detection frames 40 and 50 in the X direction in opposite phases. In this case, when the first input voltage drVn and the second input voltage drVp in opposite phases are applied to the first and second movable electrodes 45 and 55, respectively, the first output voltage Vn output from the first and third fixation electrodes 66 and 76 and the second output voltage Vp output from the second and fourth fixation electrodes 67 and 77 can be obtained, and the angular acceleration acting on the MEMS device 1 can be accurately calculated based on the first and second output voltages Vn and Vp.

The first and second output voltages Vn and Vp here are symmetrical to each other such that the voltages are in opposite phases. Further, the first and second drive frames 20 and 30 are mechanically coupled by the coupling spring 5, and hence, the first and second drive frames 20 and 30 can easily be synchronized with each other and be accurately excited in opposite phases. Further, the package stress that may be generated when the MEMS device 1 is mounted on a circuit substrate, for example, and the variations in shape that may occur when the first and second drive frames 20 and 30 are formed in a MEMS formation process may similarly affect the first and second drive frames 20 and 30. As a result, there can be provided a differential gyro sensor that can calculate the difference between the first and second output voltages Vn and Vp to cancel the common mode noise caused by the effect and thereby accurately detect the change in angular acceleration.

(2)

The MEMS device 1 may further include the first and second displacement detection units 86 and 96 that detect the displacement of the first drive frame 20 in the Y direction, and the third and fourth displacement detection units 106 and 116 that detect the displacement of the second drive frame 30 in the Y direction.

As a result, the first to fourth displacement detection units 86, 96, 106, and 116 can detect the displacement of the first and second drive frames 20 and 30 in the Y direction. Hence, the excitation of the first and second drive frames 20 and 30 by the first to fourth excitation units 80, 90, 100, and 110 can be accurately controlled based on the detected displacement.

(3)

The potential of the first drive frame 20 may be the same as the potential of the first movable electrode 45, the potential of the second drive frame 30 may be the same as the potential of the second movable electrode 55, and the coupling spring 5 may include the first coupling spring 5*a* connected to the first drive frame 20, the second coupling spring 5*b* connected to the second drive frame 30, and the IJ 6 that couples the first coupling spring 5*a* and the second coupling spring 5*b*.

As a result, the first and second movable electrodes 45 and 55 can be mechanically coupled through the first and second detection frames 40 and 50, the first and second detection springs 47 and 57, the first and second drive frames 20 and 30, and the coupling spring 5, and the first and second movable electrodes 45 and 55 can be electrically insulated by the IJ 6 in the coupling spring 5.

(4)

The first fixation frame 60 may be positioned on the Y1 side of the first detection frame 40, the first fixation electrode 66 and the second fixation electrode 67 may extend from the first fixation frame 60 toward the Y2 side, and the MEMS device 1 may further include the first fixation fourth frame 65 between the first detection frame 40 and the tip of the first fixation electrode 66 and the second fixation electrode 67, the potential of the first fixation fourth frame 65 being the same as the potential of the first fixation frame 60.

As a result, when the first detection frame 40 is excessively displaced toward the Y1 side, the first fixation fourth frame 65 can hit the first detection frame 40 first, to prevent the contact of the first detection frame 40 and the first and second fixation electrodes 66 and 67. That is, the first and second fixation electrodes 66 and 67 do not have to be excessively separated from the first detection frame 40 to reserve a gap between the first detection frame 40 and the first and second fixation electrodes 66 and 67, and the facing area of the first and second fixation electrodes 66 and 67 and the first movable electrode 45 can easily be reserved. As a result, the electrostatic capacitance of the first and second capacitors C1 and C2 provided between the first and second fixation electrodes 66 and 67 and the first movable electrode 45 can easily be reserved, and the detection accuracy of the first sensor 3*a* can easily be reserved. The first fixation fourth frame 65 provides a stopper portion according to an embodiment of the present disclosure.

(5)

The first fixation fourth frame 65 may be supported by the first fixation third frame 64 extending from the first fixation second frame 63 toward the Y2 side.

As a result, the first fixation fourth frame 65 (stopper portion) can suitably be supported by the first fixation frame 60, and the potential of the first fixation fourth frame 65 can be the same as the potential of the first fixation frame 60. Thus, the first fixation third frame 64 provides a stopper support portion according to an embodiment of the present disclosure.

(6)

The first fixation third frame 64 is positioned between the first fixation electrode 66 and the second fixation electrode 67.

As a result, the first fixation third frame 64 (stopper support portion) existing between the first and second fixation electrodes 66 and 67 can electrically insulate the first and second fixation electrodes 66 and 67.

(7)

The first fixation third frame 64 is coupled to each of the first fixation electrode 66 and the second fixation electrode 67 through the IJ 6.

As a result, the first and second fixation electrodes 66 and 67 are supported by the first fixation third frame 64 (stopper support portion), and hence, the support rigidity of the first and second fixation electrodes 66 and 67 can easily be increased.

Although the effects of (4) to (7) have been described for the first sensor 3*a*, similar effects can also be obtained for the second sensor 3*b*.

Second Embodiment

A MEMS device 200 according to a second embodiment of the present disclosure will be described with reference to FIGS. 7 to 11. In the following description, the same reference signs are provided to the same components as in the MEMS device 1 according to the first embodiment. The same reference signs in 200*s* and 300*s* are provided to the corresponding components, and the description will not be repeated.

Figure 7:
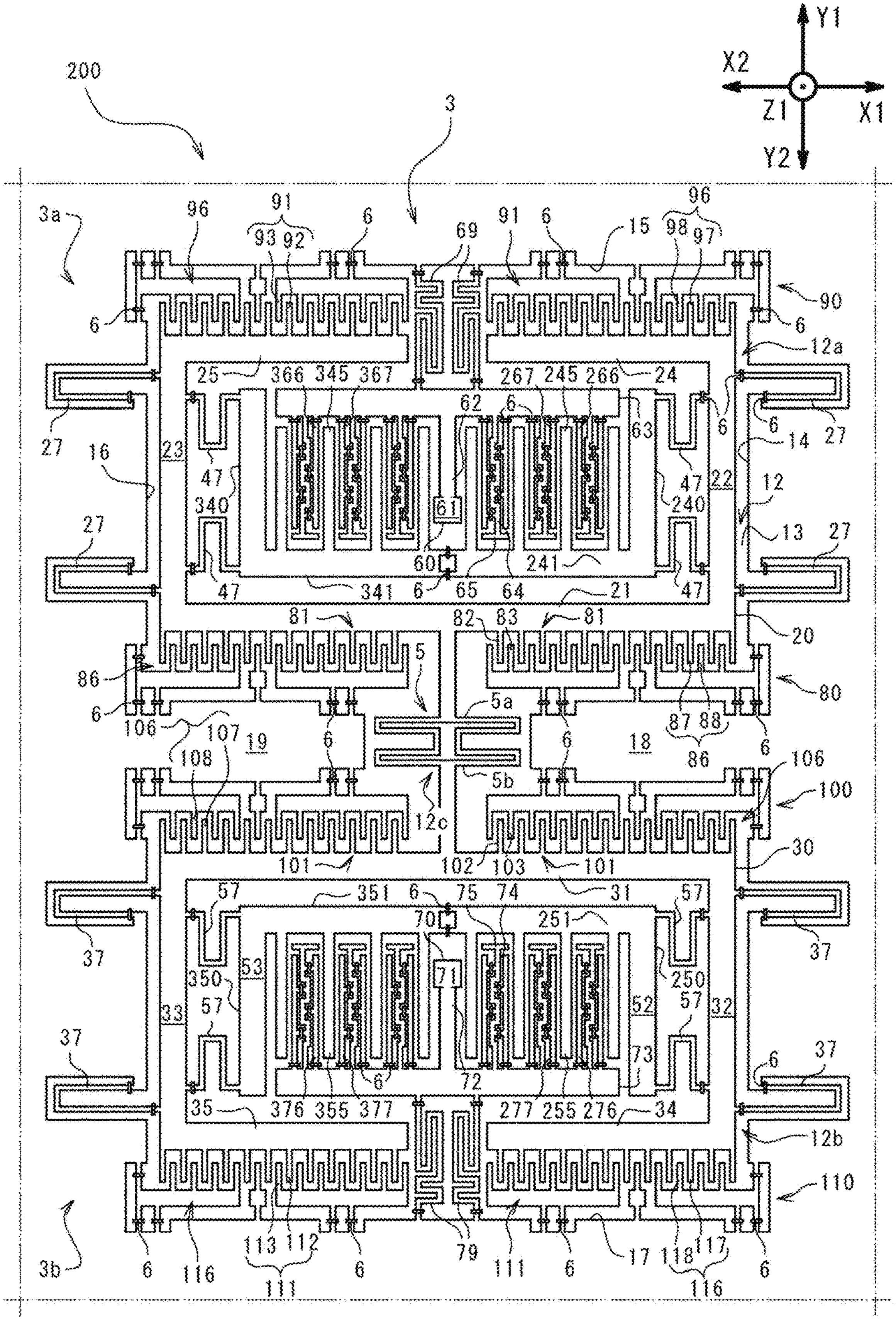
FIG. 7 is a plan view schematically illustrating the sensor unit according to a second embodiment of the present disclosure.

FIG. 7 is a plan view of the MEMS device 200. As illustrated in FIG. 7, the MEMS device 200 includes first and second movable electrodes 245 and 255 similarly to the MEMS device 1 according to the first embodiment, but the MEMS device 200 is different from the MEMS device 1 in that the MEMS device 200 further includes a third movable electrode 345 and a fourth movable electrode 355. The MEMS device 200 includes first to fourth fixation electrodes 266, 267, 276, and 277 similarly to the MEMS device 1, but the MEMS device 200 is different from the MEMS device 1 in that the MEMS device 200 further includes a fifth fixation electrode 366, a sixth fixation electrode 367, a seventh fixation electrode 376, and an eighth fixation electrode 377. The arrangement of the IJ 6 in the MEMS device 200 is also different from that in the MEMS device 1.

In the present embodiment, the parts corresponding to the first detection frame 40 (first detection first frame 41) and the second detection frame 50 (second detection first frame 51) in the MEMS device 1 are partitioned, by the IJ 6 provided at the center part of each part, into a first detection frame 240 and a second detection frame 250 positioned on the X1 side of the IJ 6 and a third detection frame 340 and a fourth detection frame 350 positioned on the X2 side, respectively. The first detection frame 240 and the third detection frame 340 are electrically insulated and mechanically coupled through the IJ 6. The second detection frame 250 and the fourth detection frame 350 are electrically insulated and mechanically coupled through the IJ 6.

The first movable electrode 245 extends from a first detection first frame 241 toward the Y1 side. The second movable electrode 255 extends from a second detection first frame 251 toward the Y2 side. The third movable electrode 345 extends from a third detection first frame 341 toward the Y1 side. The fourth movable electrode 355 extends from a fourth detection first frame 351 toward the Y2 side. The third movable electrode 345 is electrically connected to the second movable electrode 255 through the unillustrated device wiring, and the potential of the third movable electrode 345 is the same as the potential of the second movable electrode 255. The fourth movable electrode 355 is electrically connected to the first movable electrode 245 through the unillustrated device wiring, and the potential of the fourth movable electrode 355 is the same as the potential of the first movable electrode 245.

The first movable electrode 245 is positioned on the X1 side relative to the third movable electrode 345. The second movable electrode 255 is positioned on the X1 side relative to the fourth movable electrode 355. The first movable electrode 245 is arranged point-symmetrically to the fourth movable electrode 355 with respect to the center of the sensor unit 3 in the X direction and the Y direction. The second movable electrode 255 is arranged point-symmetrically to the third movable electrode 345 with respect to the center of the sensor unit 3.

The first to fourth fixation electrodes 266, 267, 276, and 277 correspond to the first to fourth fixation electrodes 66, 67, 76, and 77 of the MEMS device 1, respectively. The first fixation electrode 266 faces the first movable electrode 245 from the X1 side, and the second fixation electrode 267 faces the first movable electrode 245 from the X2 side. The third fixation electrode 276 faces the second movable electrode 255 from the X1 side, and the fourth fixation electrode 277 faces the second movable electrode 255 from the X2 side.

The fifth and sixth fixation electrodes 366 and 367 are connected to the first fixation second frame 63 through the IJ 6 and extend toward the Y2 side. The fifth and sixth fixation electrodes 366 and 367 are electrically insulated from each other. The seventh and eighth fixation electrodes 376 and 377 are connected to a second fixation second frame 73 through the IJ 6 and extend toward the Y1 side. The seventh and eighth fixation electrodes 376 and 377 are electrically insulated from each other.

The fifth fixation electrode 366 faces the third movable electrode 345 from the X2 side. The sixth fixation electrode 367 faces the third movable electrode 345 from the X1 side. The seventh fixation electrode 376 faces the fourth movable electrode 355 from the X2 side. The eighth fixation electrode 377 faces the fourth movable electrode 355 from the X1 side.

The fifth fixation electrode 366 is electrically connected to the first fixation electrode 266 through the unillustrated device wiring, and the potential of the fifth fixation electrode 366 is the same as the potential of the first fixation electrode 266. The sixth fixation electrode 367 is electrically connected to the second fixation electrode 267 through the unillustrated device wiring, and the potential of the sixth fixation electrode 367 is the same as the potential of the second fixation electrode 267. The seventh fixation electrode 376 is electrically connected to the fifth fixation electrode 366 through the unillustrated device wiring, and the potential of the seventh fixation electrode 376 is the same as the potential of the fifth fixation electrode 366 (that is, also the same as the potential of the first fixation electrode 266). The eighth fixation electrode 377 is electrically connected to the sixth fixation electrode 367 through the unillustrated device wiring, and the potential of the eighth fixation electrode 377 is the same as the potential of the sixth fixation electrode 367 (that is, also the same as the potential of the second fixation electrode 267).

The arrangement of the IJ 6 will be described. The IJ 6 is not provided on the coupling spring 5, and the first coupling spring 5*a* and the second coupling spring 5*b* are directly connected. Meanwhile, the first and second drive frames 20 and 30 are provided with the IJ 6 at connections to the first and second drive springs 27 and 37 and connections to the first and second detection springs 47 and 57. Hence, the first and second drive frames 20 and 30 are set to the same potential and are electrically insulated from the first to fourth detection frames 240, 250, 340, and 350 through the IJ 6.

Figure 8:
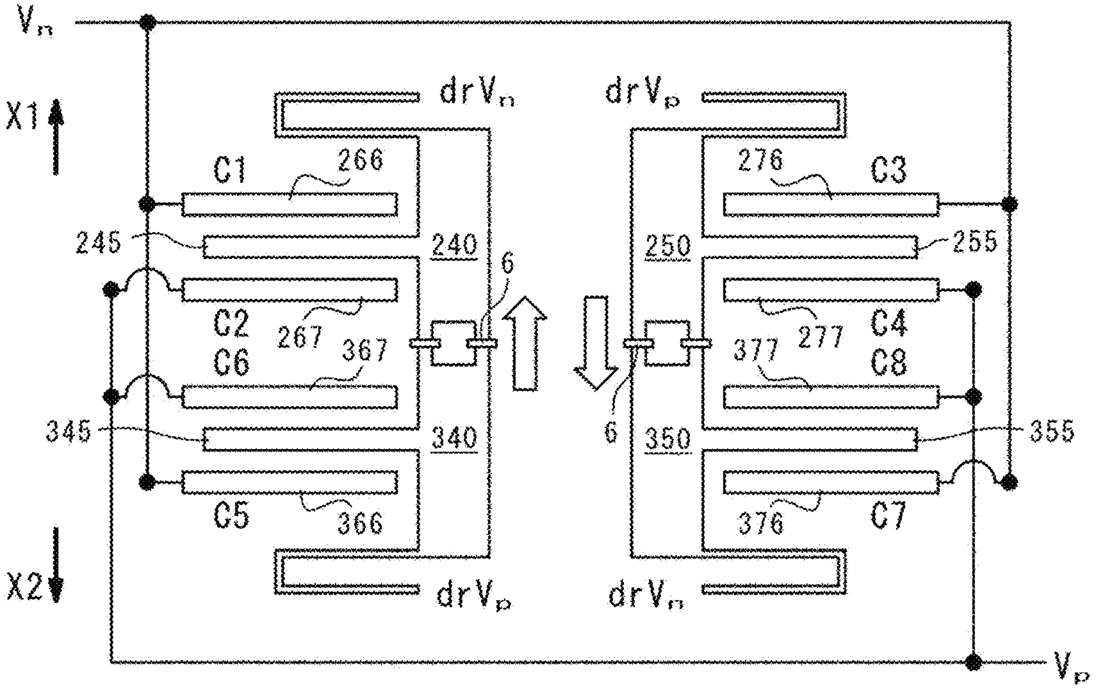
FIG. 8 is a simplified configuration diagram of the sensor unit.

FIG. 8 illustrates a simplified schematic configuration of the MEMS device 200. As illustrated in FIG. 8, in the MEMS device 200, as in the MEMS device 1, the first movable electrode 245 and the first fixation electrode 266 facing the first movable electrode 245 form the first capacitor C1; the first movable electrode 245 and the second fixation electrode 267 facing the first movable electrode 245 form the second capacitor C2; the second movable electrode 255 and the third fixation electrode 276 facing the second movable electrode 255 form the third capacitor C3; and the second movable electrode 255 and the fourth fixation electrode 277 facing the second movable electrode 255 form the fourth capacitor C4.

In the MEMS device 200, further, the third movable electrode 345 and the fifth fixation electrode 366 facing the third movable electrode 345 form a fifth capacitor C5; the third movable electrode 345 and the sixth fixation electrode 367 facing the third movable electrode 345 form a sixth capacitor C6; the fourth movable electrode 355 and the seventh fixation electrode 376 facing the fourth movable electrode 355 form a seventh capacitor C7; and the fourth movable electrode 355 and the eighth fixation electrode 377 facing the fourth movable electrode 355 form an eighth capacitor C8.

That is, in the MEMS device 200, across the center of the sensor unit 3 in the X direction and the Y direction, as in the MEMS device 1, a differential circuit including the first to fourth capacitors C1 to C4 is formed on the X1 side, and another differential circuit including the fifth to eighth capacitors C5 to C8 is formed on the X2 side. The differential circuit formed on the X2 side is point-symmetrical to the differential circuit formed on the X1 side with respect to the center of the sensor unit 3.

Figure 9:
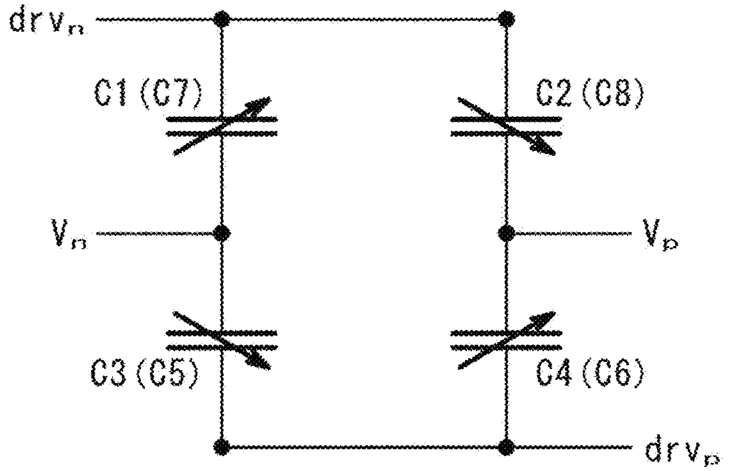
FIG. 9 is an equivalent circuit diagram of FIG. 8.

FIG. 9 is an equivalent circuit diagram of the sensor unit 3 of the MEMS device 200.

Figure 10:
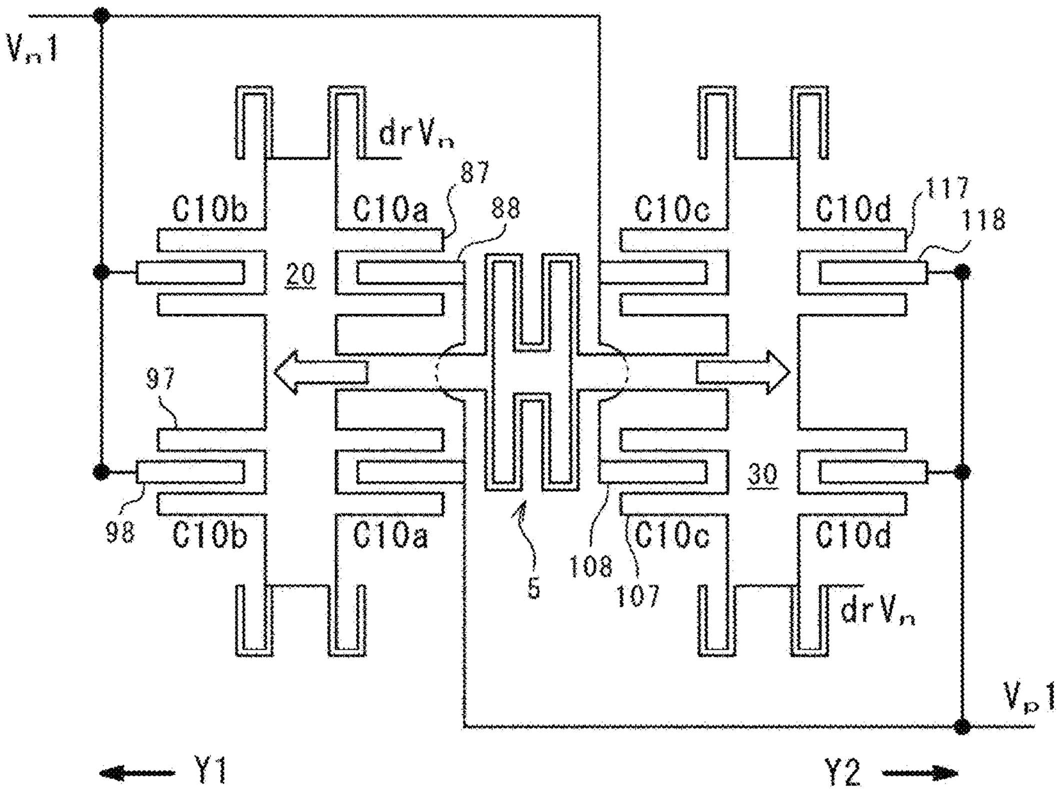
FIG. 10 is a simplified configuration diagram of the displacement detection unit.
Figure 11:
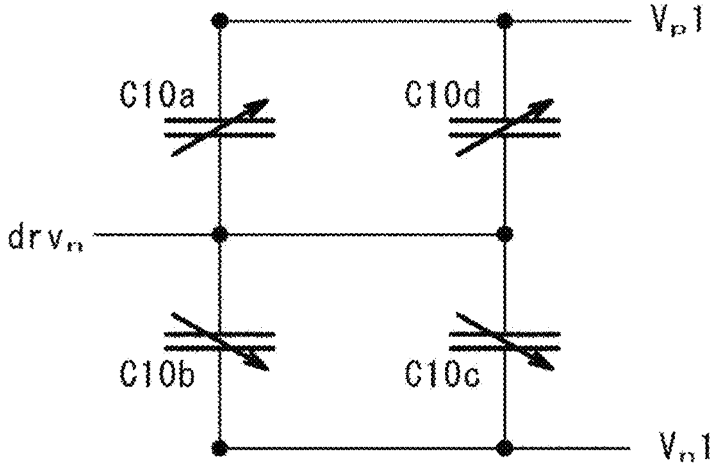
FIG. 11 is an equivalent circuit diagram of FIG. 10.

FIG. 10 illustrates a schematic configuration diagram regarding the detection of displacement of the first drive frame 20 and the second drive frame 30 of the sensor unit 3 in the Y direction. As illustrated in FIG. 10, the first to fourth displacement detection capacitors C10*a* to C10*d* are formed as in the MEMS device 1. The first and second drive frames 20 and 30 are set to the same potential, and only the first input voltage drVn is applied. Hence, only the connection of wiring is different from that of the MEMS device 1. FIG. 11 is an equivalent circuit diagram corresponding to the schematic configuration diagram of FIG. 10.

The MEMS device 200 according to the present embodiment can obtain the following effects.

(1)

The MEMS device 200 includes the components of the MEMS device 1 and further includes

- the third detection frame 340 coupled to the first detection frame 240 through the IJ 6,
- the fourth detection frame 350 coupled to the second detection frame 250 through the IJ 6,
- the third movable electrode 345 extending in the Y direction from the third detection frame 340, the potential of the third movable electrode 345 being the same as the potential of the second movable electrode 255,
- the fourth movable electrode 355 extending in the Y direction from the fourth detection frame 350 and electrically insulated from the third movable electrode 345, the potential of the fourth movable electrode 355 being the same as the potential of the first movable electrode 245,
- the fifth fixation electrode 366 extending in the Y direction from the first fixation frame 260 and facing the third movable electrode 345 from the X2 side, the potential of the fifth fixation electrode 366 being the same as the potential of the first fixation electrode 266,
- the sixth fixation electrode 367 extending in the Y direction from the first fixation frame 260, facing the third movable electrode 345 from the X1 side, and electrically insulated from the fifth fixation electrode 366, the potential of the sixth fixation electrode 367 being the same as the potential of the second fixation electrode 267,
- the seventh fixation electrode 376 extending in the Y direction from the second fixation frame 270 and facing the fourth movable electrode 355 from the X2 side, the potential of the seventh fixation electrode 376 being the same as the potential of the fifth fixation electrode 366, and
- the eighth fixation electrode 377 extending in the Y direction from the second fixation frame 270 and facing the fourth movable electrode 355 from the X1 side, the potential of the eighth fixation electrode 377 being the same as the potential of the sixth fixation electrode 367, in which
- each of the fifth fixation electrode 366 and the sixth fixation electrode 367 is coupled to the first fixation frame 260 through the IJ 6, and
- each of the seventh fixation electrode 376 and the eighth fixation electrode 377 is coupled to the second fixation frame 270 through the IJ 6.

As a result, the first and second movable electrodes 245 and 255 and the first to fourth fixation electrodes 266, 267, 276, and 277 can provide a fully differential circuit, and the third and fourth movable electrodes 345 and 355 and the fifth to eighth fixation electrodes 366, 367, 376, and 377 can provide another fully differential circuit. In addition, the first to fourth movable electrodes 245, 255, 345, and 355 are mechanically connected. Hence, the common mode noise that may be generated in the circuits can be cancelled, and the angular acceleration can be more accurately detected.

(2)

The potential of the first drive frame 20 and the potential of the second drive frame 30 may be the same.

As a result, the first drive frame 20 and the second drive frame 30 can be mechanically coupled without the involvement of the IJ 6.

(3)

The first movable electrode 245 may be positioned on the X1 side relative to the third movable electrode 345, and

- the second movable electrode 255 may be positioned on the X1 side relative to the fourth movable electrode 355.

As a result, the first and third movable electrodes 245 and 345 provided with input voltages in opposite phases are symmetrically arranged in the Y direction. Similarly, the second and fourth movable electrodes 255 and 355 provided with input voltages in opposite phases are symmetrically arranged in the Y direction. Hence, the common mode noise that may be symmetrically generated in the Y direction in the sensor unit 3 can be cancelled, and the angular acceleration can be more accurately detected.

(4)

The first movable electrode 245 may be arranged point-symmetrically to the fourth movable electrode 355 with respect to the center of the sensor unit 3 in the X direction and the Y direction, and

- the second movable electrode 255 may be arranged point-symmetrically to the third movable electrode 345 with respect to the abovementioned center of the sensor unit 3.

As a result, the first and fourth movable electrodes 245 and 355 provided with the input voltage in the same phase are point-symmetrically arranged in the sensor unit 3. Similarly, the second and third movable electrodes 255 and 345 provided with the input voltage in the same phase are point-symmetrically arranged in the sensor unit 3. Hence, the common mode noise that may be generated point-symmetrically with respect to the center in the sensor unit 3 is effectively cancelled, and the angular acceleration can be more accurately detected.

Note that the present disclosure is not limited to the configurations described in the embodiments, and the present disclosure can be changed in various ways.

Figure 12:
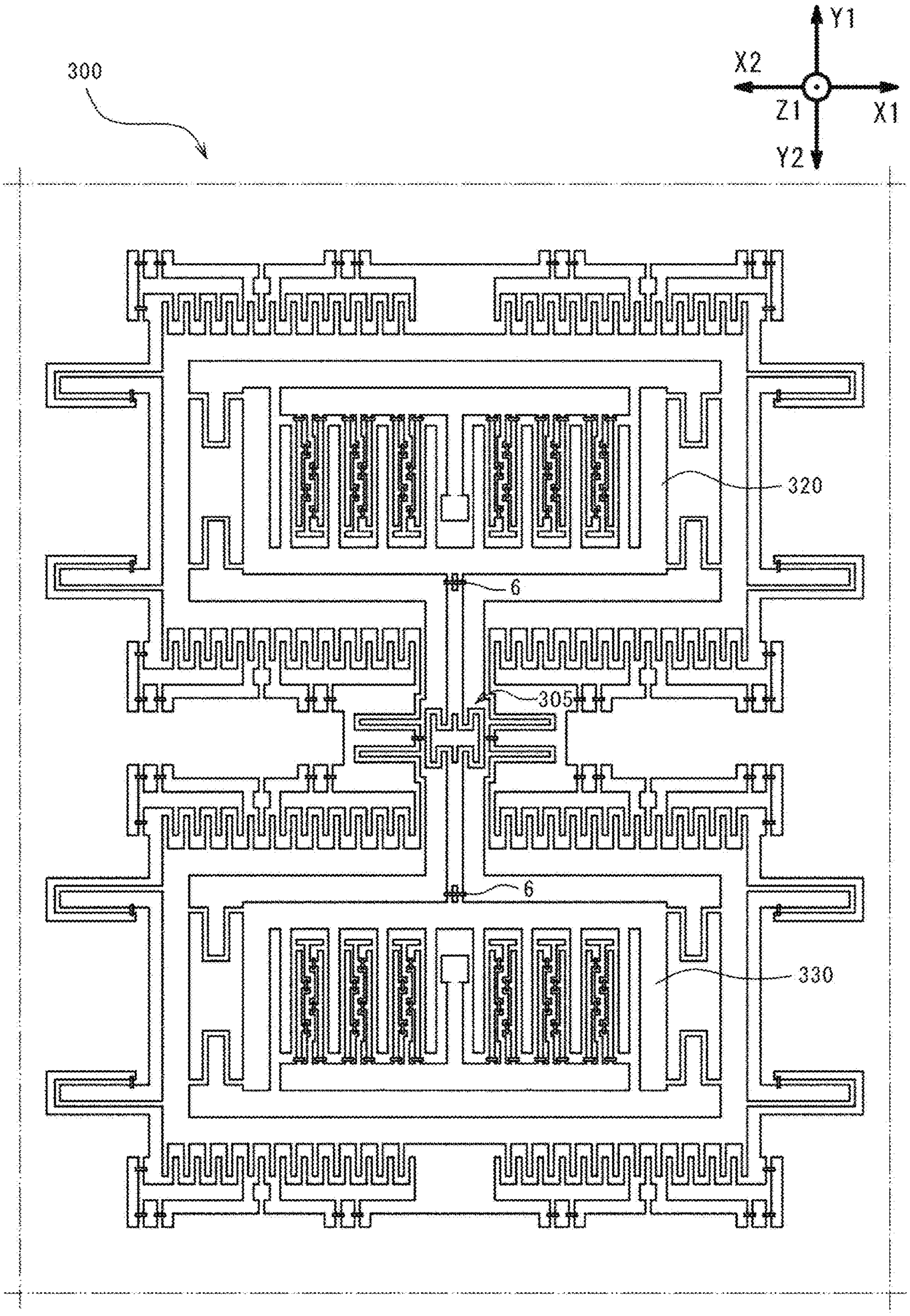
FIG. 12 is a plan view schematically illustrating the sensor unit according to a modification.

FIG. 12 illustrates a MEMS device 300 according to a modification. As illustrated in FIG. 12, the MEMS device 300 is based on the MEMS device 1 and is modified to couple a first detection frame 320 and a second detection frame 330 by a coupling spring 305 that can be expanded and contracted in the X direction. The first detection frame 320 and the second detection frame 330 are electrically insulated and mechanically coupled to each other by the IJ 6 at both ends of the coupling spring 305 in the Y direction. In this way, the first and second detection frames 320 and 330 can be further synchronized and easily displaced in the X direction in opposite phases, and the angular acceleration can be more accurately detected.

Figure 13:
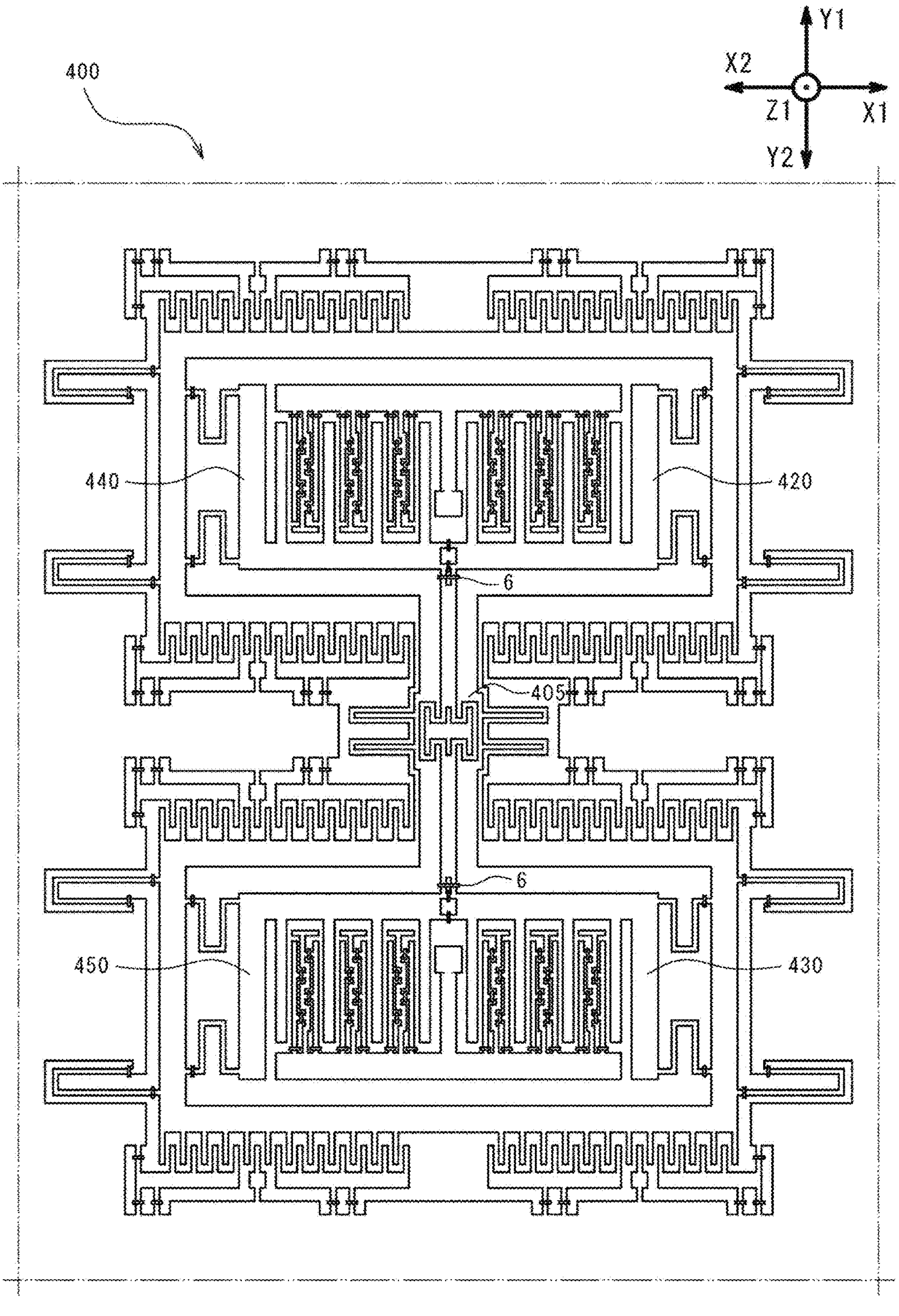
FIG. 13 is a plan view schematically illustrating the sensor unit according to another modification.

FIG. 13 illustrates a MEMS device 400 according to another modification. As illustrated in FIG. 13, the MEMS device 400 is based on the MEMS device 200 and is modified to couple a first detection frame 420 (and/or a third detection frame 440) and a second detection frame 430 (and/or a fourth detection frame 450) by a coupling spring 405 that can be expanded and contracted in the X direction. The first detection frame 420 and the second detection frame 430 are electrically insulated and mechanically coupled to each other by the IJ 6 at both ends of the coupling spring 405 in the Y direction. In this way, the first and second detection frames 420 and 430 can be further synchronized and easily displaced in the X direction in opposite phases, and the angular acceleration can be more accurately detected.

Supplement

The MEMS device according to the present disclosure provides the following modes.

Mode 1

A MEMS device including:

a substrate including a first main surface and a second main surface facing the first main surface;

a recessed portion recessed from the first main surface toward the second main surface relative to the substrate; and a sensor unit positioned in the recessed portion, in which the sensor unit includes a first drive frame excited in a first direction, a second drive frame mechanically connected to the first drive frame through a coupling spring and excited in the first direction in a phase opposite a phase of the first drive frame, a first detection frame mechanically connected to the first drive frame through a first drive spring, displaceable in the first direction along with the first drive frame, and displaceable in a second direction orthogonal to the first direction relative to the first drive frame, a second detection frame mechanically connected to the second drive frame through a second drive spring, displaceable in the first direction along with the second drive frame, and displaceable in the second direction relative to the second drive frame, a first fixation frame supported in such a manner that the first fixation frame is not movable relative to a wall surface defining the recessed portion, a second fixation frame supported in such a manner that the second fixation frame is not movable relative to the wall surface defining the recessed portion, a first excitation unit that uses electrostatic attraction to excite the first drive frame in the first direction, a second excitation unit that uses electrostatic attraction to excite the second drive frame in the first direction in a phase opposite a phase in the excitation by the first excitation unit, a first movable electrode extending in the first direction from the first detection frame, a second movable electrode extending in the first direction from the second detection frame and electrically insulated from the first movable electrode, a first fixation electrode extending in the first direction from the first fixation frame and facing the first movable electrode from a first side in the second direction, a second fixation electrode extending in the first direction from the first fixation frame, facing the first movable electrode from a second side opposite the first side in the second direction, and electrically insulated from the first fixation electrode, a third fixation electrode extending in the first direction from the second fixation frame and facing the second movable electrode from the first side in the second direction, potential of the third fixation electrode being the same as potential of the first fixation electrode, and a fourth fixation electrode extending in the first direction from the second fixation frame and facing the second movable electrode from the second side in the second direction, potential of the fourth fixation electrode being the same as potential of the second fixation electrode, each of the first fixation electrode and the second fixation electrode is coupled to the first fixation frame through an isolation joint, the isolation joint being configured to electrically insulate and mechanically couple two members, and each of the third fixation electrode and the fourth fixation electrode is coupled to the second fixation frame through the isolation joint.

Mode 2

The MEMS device according to mode 1, further including:

a first displacement detection unit that detects a displacement of the first drive frame in the first direction; and a second displacement detection unit that detects a displacement of the second drive frame in the first direction.

Mode 3

The MEMS device according to mode 1 or 2, in which potential of the first drive frame is the same as the potential of the first fixation electrode, potential of the second drive frame is the same as the potential of the second fixation electrode, and the coupling spring includes a first coupling spring connected to the first drive frame, a second coupling spring connected to the second drive frame, and the isolation joint that couples the first coupling spring and the second coupling spring.

Mode 4

The MEMS device according to mode 1 or 2, further including:

a third detection frame coupled to the first detection frame through the isolation joint;

a fourth detection frame coupled to the second detection frame through the isolation joint;

a third movable electrode extending in the first direction from the third detection frame, potential of the third movable electrode being the same as potential of the second movable electrode;

a fourth movable electrode extending in the first direction from the fourth detection frame and electrically insulated from the third movable electrode, potential of the fourth movable electrode being the same as potential of the first movable electrode;

a fifth fixation electrode extending in the first direction from the first fixation frame and facing the third movable electrode from the second side in the second direction, potential of the fifth fixation electrode being the same as the potential of the first fixation electrode;

a sixth fixation electrode extending in the first direction from the first fixation frame, facing the third movable electrode from the first side in the second direction, and electrically insulated from the fifth fixation electrode, potential of the sixth fixation electrode being the same as the potential of the second fixation electrode;

a seventh fixation electrode extending in the first direction from the second fixation frame and facing the fourth movable electrode from the second side in the second direction, potential of the seventh fixation electrode being the same as the potential of the fifth fixation electrode; and an eighth fixation electrode extending in the first direction from the second fixation frame and facing the fourth movable electrode from the first side in the second direction, a potential of the eighth fixation electrode being the same as the potential of the sixth fixation electrode, in which each of the fifth fixation electrode and the sixth fixation electrode is coupled to the first fixation frame through the isolation joint, and each of the seventh fixation electrode and the eighth fixation electrode is coupled to the second fixation frame through the isolation joint.

Mode 5

The MEMS device according to mode 4, in which potential of the first drive frame is the same as potential of the second drive frame.

Mode 6

6. The MEMS device according to mode 4 or 5, in which the first movable electrode is positioned on the first side in the second direction relative to the third movable electrode, and the second movable electrode is positioned on the first side in the second direction relative to the fourth movable electrode.

Mode 7

The MEMS device according to any one of modes 4 to 6, in which the first movable electrode is arranged point-symmetrically to the fourth movable electrode with respect to a center of the sensor unit in the first direction and the second direction, and the second movable electrode is arranged point-symmetrically to the third movable electrode with respect to the center of the sensor unit.

Mode 8

The MEMS device according to any one of modes 1 through 7, in which the first fixation frame is positioned on a first side of the first detection frame in the first direction, the first fixation electrode and the second fixation electrode extend from the first fixation frame toward a second side that is an opposite side of the first side in the first direction, and the MEMS device further includes a stopper portion between the first detection frame and a tip of the first fixation electrode and the second fixation electrode, potential of the stopper portion being the same as potential of the first fixation frame.

Mode 9

The MEMS device according to mode 8, in which the stopper portion is supported by a stopper support portion extending from the first fixation frame toward the second side in the first direction.

Mode 10

The MEMS device according to mode 9, in which the stopper support portion is positioned between the first fixation electrode and the second fixation electrode.

Mode 11

The MEMS device according to mode 9 or 10, in which the stopper support portion is coupled to each of the first fixation electrode and the second fixation electrode through the isolation joint.

What is claimed is:

1. A micro electro mechanical system device comprising:

a substrate including a first main surface and a second main surface facing the first main surface;

a recessed portion recessed from the first main surface toward the second main surface relative to the substrate; and a sensor unit positioned in the recessed portion, wherein the sensor unit includes a first drive frame excited in a first direction, a second drive frame mechanically connected to the first drive frame through a coupling spring and excited in the first direction in a phase opposite a phase of the first drive frame, a first detection frame mechanically connected to the first drive frame through a first drive spring, displaceable in the first direction along with the first drive frame, and displaceable in a second direction orthogonal to the first direction relative to the first drive frame, a second detection frame mechanically connected to the second drive frame through a second drive spring, displaceable in the first direction along with the second drive frame, and displaceable in the second direction relative to the second drive frame, a first fixation frame supported in such a manner that the first fixation frame is not movable relative to a wall surface defining the recessed portion, a second fixation frame supported in such a manner that the second fixation frame is not movable relative to the wall surface defining the recessed portion, a first excitation unit that uses electrostatic attraction to excite the first drive frame in the first direction, a second excitation unit that uses electrostatic attraction to excite the second drive frame in the first direction in a phase opposite a phase in the excitation by the first excitation unit, a first movable electrode extending in the first direction from the first detection frame, a second movable electrode extending in the first direction from the second detection frame and electrically insulated from the first movable electrode, a first fixation electrode extending in the first direction from the first fixation frame and facing the first movable electrode from a first side in the second direction, a second fixation electrode extending in the first direction from the first fixation frame, facing the first movable electrode from a second side opposite the first side in the second direction, and electrically insulated from the first fixation electrode, a third fixation electrode extending in the first direction from the second fixation frame and facing the second movable electrode from the first side in the second direction, potential of the third fixation electrode being the same as potential of the first fixation electrode, and a fourth fixation electrode extending in the first direction from the second fixation frame and facing the second movable electrode from the second side in the second direction, potential of the fourth fixation electrode being the same as potential of the second fixation electrode, each of the first fixation electrode and the second fixation electrode is coupled to the first fixation frame through an isolation joint, the isolation joint being configured to electrically insulate and mechanically couple two members, and each of the third fixation electrode and the fourth fixation electrode is coupled to the second fixation frame through the isolation joint.

2. The micro electro mechanical system device according to claim 1, further comprising:

a first displacement detection unit that detects a displacement of the first drive frame in the first direction; and a second displacement detection unit that detects a displacement of the second drive frame in the first direction.

3. The micro electro mechanical system device according to claim 1, wherein potential of the first drive frame is the same as the potential of the first fixation electrode, potential of the second drive frame is the same as the potential of the second fixation electrode, and the coupling spring includes a first coupling spring connected to the first drive frame, a second coupling spring connected to the second drive frame, and the isolation joint that couples the first coupling spring and the second coupling spring.

4. The micro electro mechanical system device according to claim 1, further comprising:

a third detection frame coupled to the first detection frame through the isolation joint;

a fourth detection frame coupled to the second detection frame through the isolation joint;

a third movable electrode extending in the first direction from the third detection frame, potential of the third movable electrode being the same as potential of the second movable electrode;

a fourth movable electrode extending in the first direction from the fourth detection frame and electrically insulated from the third movable electrode, potential of the fourth movable electrode being the same as potential of the first movable electrode;

a fifth fixation electrode extending in the first direction from the first fixation frame and facing the third movable electrode from the second side in the second direction, potential of the fifth fixation electrode being the same as the potential of the first fixation electrode;

a sixth fixation electrode extending in the first direction from the first fixation frame, facing the third movable electrode from the first side in the second direction, and electrically insulated from the fifth fixation electrode, potential of the sixth fixation electrode being the same as the potential of the second fixation electrode;

a seventh fixation electrode extending in the first direction from the second fixation frame and facing the fourth movable electrode from the second side in the second direction, potential of the seventh fixation electrode being the same as the potential of the fifth fixation electrode; and an eighth fixation electrode extending in the first direction from the second fixation frame and facing the fourth movable electrode from the first side in the second direction, potential of the eighth fixation electrode being the same as the potential of the sixth fixation electrode, wherein each of the fifth fixation electrode and the sixth fixation electrode is coupled to the first fixation frame through the isolation joint, and each of the seventh fixation electrode and the eighth fixation electrode is coupled to the second fixation frame through the isolation joint.

5. The micro electro mechanical system device according to claim 4, wherein potential of the first drive frame is the same as potential of the second drive frame.

6. The micro electro mechanical system device according to claim 4, wherein the first movable electrode is positioned on the first side in the second direction relative to the third movable electrode, and the second movable electrode is positioned on the first side in the second direction relative to the fourth movable electrode.

7. The micro electro mechanical system device according to claim 6, wherein the first movable electrode is arranged point-symmetrically to the fourth movable electrode with respect to a center of the sensor unit in the first direction and the second direction, and the second movable electrode is arranged point-symmetrically to the third movable electrode with respect to the center of the sensor unit.

8. The micro electro mechanical system device according to claim 1, wherein the first fixation frame is positioned on a first side of the first detection frame in the first direction, the first fixation electrode and the second fixation electrode extend from the first fixation frame toward a second side that is an opposite side of the first side in the first direction, and the micro electro mechanical system device further includes a stopper portion between the first detection frame and a tip of the first fixation electrode and the second fixation electrode, potential of the stopper portion being the same as potential of the first fixation frame.

9. The micro electro mechanical system device according to claim 8, wherein the stopper portion is supported by a stopper support portion extending from the first fixation frame toward the second side in the first direction.

10. The micro electro mechanical system device according to claim 9, wherein the stopper support portion is positioned between the first fixation electrode and the second fixation electrode.

11. The micro electro mechanical system device according to claim 10, wherein the stopper support portion is coupled to each of the first fixation electrode and the second fixation electrode through the isolation joint.

* * * * *